United States Patent
Butler et al.

(10) Patent No.: US 9,378,722 B2
(45) Date of Patent: Jun. 28, 2016

(54) LITHOGRAPHIC APPARATUS WITH ACTUATOR TO COMPENSATE ACOUSTIC VIBRATION

(75) Inventors: Hans Butler, Best (NL); Marc Wilhelmus Maria Van der Wijst, Veldhoven (NL); Johan Hendrik Geerke, Eindhoven (NL); Peter Paul Hempenius, Nuenen (NL); Youssef Karel Maria De Vos, Lille (BE); Joost De Pee, Veldhoven (NL); Clementius Andreas Johannes Beijers, Eindhoven (NL); Nicolaas Bernardus Roozen, Heeze (NL); Erwin Antonius Henricus Fransiscus Van den Boogaert, Someren-Eind (NL); Marco Hendrikus Hermanus Oude Nijhuis, Eindhoven (NL); Francois Xavier Debiesme, Weert (NL)

(73) Assignee: ASML NETHERLANDS B.V., Veldhoven (NL)

( * ) Notice: Subject to any disclaimer, the term of this patent is extended or adjusted under 35 U.S.C. 154(b) by 1314 days.

(21) Appl. No.: 12/331,870

(22) Filed: Dec. 10, 2008

(65) Prior Publication Data

US 2009/0195763 A1 Aug. 6, 2009

Related U.S. Application Data

(60) Provisional application No. 61/008,147, filed on Dec. 19, 2007.

(51) Int. Cl.
*G10K 11/178* (2006.01)
*G03B 27/42* (2006.01)
*G03F 7/20* (2006.01)

(52) U.S. Cl.
CPC .............. *G10K 11/178* (2013.01); *G03B 27/42* (2013.01); *G03F 7/709* (2013.01); *G10K 2210/129* (2013.01)

(58) Field of Classification Search
CPC . G03F 7/709; G10K 11/178; G10K 2210/129
USPC ................................. 355/52, 30, 53
See application file for complete search history.

(56) References Cited

U.S. PATENT DOCUMENTS

| 6,002,987 A | * 12/1999 | Kamiya et al. ................. 702/56 |
| 6,897,599 B2 | 5/2005 | Sorg et al. |
| 2006/0017908 A1 | 1/2006 | Mayama |

FOREIGN PATENT DOCUMENTS

| JP | 9-022870 | 1/1997 |
| JP | 9-260279 | 10/1997 |

(Continued)

OTHER PUBLICATIONS

Office Action in related Japanese application No. 2008-318049 mailed Jun. 8, 2011.

(Continued)

*Primary Examiner* — Chia-How Michael Liu
(74) *Attorney, Agent, or Firm* — Pillsbury Winthrop Shaw Pittman LLP

(57) ABSTRACT

A lithographic apparatus is arranged to transfer a pattern from a patterning device onto a substrate. The lithographic apparatus includes an acoustical sensor to measure a first acoustic vibration in a sensor measurement area in the lithographic apparatus. An actuator is provided to generate a second acoustic vibration in at least an area of the lithographic apparatus. Further, a control device is provided having a sensor input to receive a sensor signal of the acoustical sensor and an actuator output to provide an actuator drive signal to the actuator. The control device is arranged to drive the actuator so as to let the second acoustic vibration at least partly compensate in the area the first acoustic vibration.

28 Claims, 4 Drawing Sheets

(56) References Cited

FOREIGN PATENT DOCUMENTS

| JP | 09265137 A | 10/1997 |
|---|---|---|
| JP | 09216140 A | 8/1998 |
| JP | 2002334832 A | 11/2002 |
| JP | 2004303808 A | 10/2004 |
| JP | 2005197698 A | 7/2005 |
| JP | 2006032788 A | 2/2006 |
| JP | 2006-086448 | 3/2006 |
| JP | 2007-027371 | 2/2007 |
| JP | 2007-163904 | 6/2007 |

OTHER PUBLICATIONS

Japanese Office Action mailed Jun. 4, 2012 in corresponding Japanese Patent Application No. 2008-318049.

* cited by examiner

LITHOGRAPHIC APPARATUS WITH ACTUATOR TO COMPENSATE ACOUSTIC VIBRATION

CROSS REFERENCE TO RELATED APPLICATIONS

This application claims priority and benefit under 35 U.S.C. §119(e) to U.S. Provisional Patent Application No. 61/008,147, entitled "Lithographic Apparatus", filed on Dec. 19, 2007. The content of that application is incorporated herein in its entirety by reference.

FIELD

The present invention relates to a lithographic apparatus arranged to transfer a pattern from a patterning device on to a substrate.

BACKGROUND

A lithographic apparatus is a machine that applies a desired pattern onto a substrate, usually onto a target portion of the substrate. A lithographic apparatus can be used, for example, in the manufacture of integrated circuits (ICs). In such a case, a patterning device, which is alternatively referred to as a mask or a reticle, may be used to generate a circuit pattern to be formed on an individual layer of the IC. This pattern can be transferred onto a target portion (e.g. including part of, one, or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Conventional lithographic apparatus include so-called steppers, in which each target portion is irradiated by exposing an entire pattern onto the target portion at once, and so-called scanners, in which each target portion is irradiated by scanning the pattern through a radiation beam in a given direction (the "scanning"-direction) while synchronously scanning the substrate parallel or anti-parallel to this direction. It is also possible to transfer the pattern from the patterning device to the substrate by imprinting the pattern onto the substrate.

At present, several trends may be observed in lithography. Firstly, increasing throughput requirements of the lithographic apparatus are observed to allow the lithographic apparatus to process e.g. a larger quantity of wafers within a certain time period.

Secondly, accuracy requirements tend to be increased, which, in combination with an enhanced capability to project more detailed, i.e. finer patterns on to the substrate, allows manufacturing of substrates having more detailed patterns. As a consequence of the increasing throughput, moving parts in the lithographic apparatus tend to be moving at higher speed and with higher accelerations. Thereby, disturbances caused by such movements such as acoustic vibrations, tend to increase. Secondly because of increased accuracy requirements, a sensitivity of parts of the lithographic apparatus to such acoustic vibrations, tends to increase, at least relative to the imaging accuracy. Further more, in a lithographic apparatus, many other sources of acoustic vibration may be present, e.g. moving elements of the lithographic apparatus, gas ducts to provide a clean or cleaned gas mixture, cooling devices, fans, etc. Acoustic vibrations by any such source, or by any other source, may have an effect on a part of the lithographic apparatus, such as, however not excluded to the projection system, lens element or mirror element of the projection system, position center of a support position measurement system or substrate table position measurement system, alignment system or any other part of the lithographic apparatus.

In this document, the term acoustic vibration may contain any vibration pattern, e.g. sinusoidal, shock wave, burst, pulse, etc, and in any frequency arrange. It is a thus emphasized that the term acoustic vibration is not to be understood as being a limited to sound waves that are audible to the human ear. The acoustic vibration may be in a gas, liquid or solid.

SUMMARY

It is desirable to enhance a performance of the lithographic apparatus.

According to an embodiment of the invention, there is provided a lithographic apparatus arranged to transfer a pattern from a patterning device onto a substrate, including: a source to generate a first acoustic vibration, an actuator to generate a second acoustic vibration in at least an area of interest of the lithographic apparatus, and a control device having an actuator output to provide an actuator drive signal to the actuator, the control device being adapted to drive the actuator to at least partly compensate the first acoustic vibration in the area of interest by the second acoustic vibration.

BRIEF DESCRIPTION OF THE DRAWINGS

Embodiments of the invention will now be described, by way of example only, with reference to the accompanying schematic drawings in which corresponding reference symbols indicate corresponding parts, and in which.

DETAILED DESCRIPTION

Figure 1:
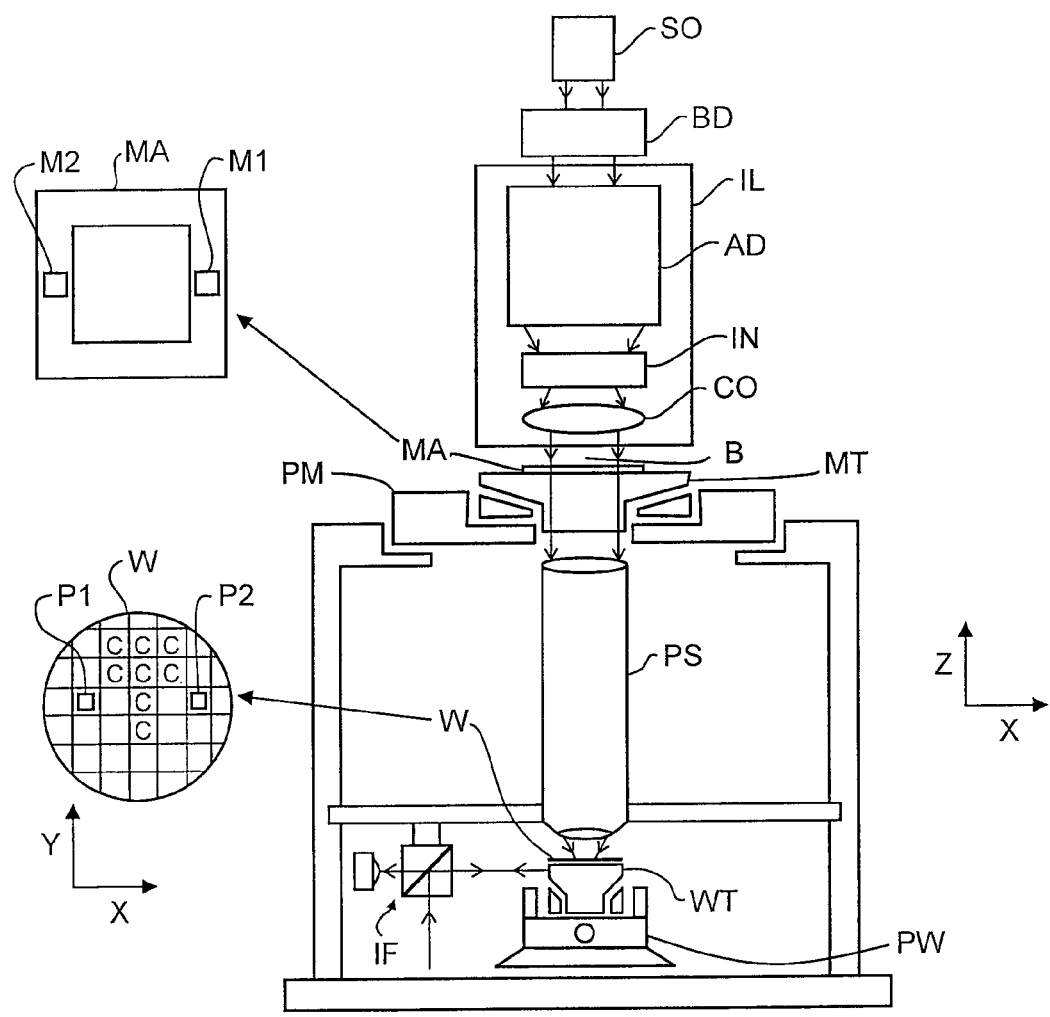
FIG. 1 depicts a lithographic apparatus in which an embodiment of the invention may be provided.

FIG. 1 schematically depicts a lithographic apparatus according to one embodiment of the invention. The apparatus includes an illumination system (illuminator) IL configured to condition a radiation beam B (e.g. UV radiation or any other suitable radiation), a patterning device support or support structure (e.g. a mask table) MT constructed to support a patterning device (e.g. a mask) MA and connected to a first positioning device PM configured to accurately position the patterning device in accordance with certain parameters. The apparatus also includes a substrate table (e.g. a wafer table) WT or "substrate support" constructed to hold a substrate (e.g. a resist-coated wafer) W and connected to a second positioning device PW configured to accurately position the substrate in accordance with certain parameters. The apparatus further includes a projection system (e.g. a refractive projection lens system) PS configured to project a pattern imparted to the radiation beam B by patterning device MA onto a target portion C (e.g. including one or more dies) of the substrate W.

The illumination system may include various types of optical components, such as refractive, reflective, magnetic, electromagnetic, electrostatic or other types of optical components, or any combination thereof, for directing, shaping, or controlling radiation.

The patterning device support or support structure holds the patterning device in a manner that depends on the orientation of the patterning device, the design of the lithographic apparatus, and other conditions, such as for example whether or not the patterning device is held in a vacuum environment. The patterning device support or support structure can use mechanical, vacuum, electrostatic or other clamping techniques to hold the patterning device. The patterning device support or support structure may be a frame or a table, for example, which may be fixed or movable as required. The patterning device support or support structure may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section so as to create a pattern in a target portion of the substrate. It should be noted that the pattern imparted to the radiation beam may not exactly correspond to the desired pattern in the target portion of the substrate, for example if the pattern includes phase-shifting features or so called assist features. Generally, the pattern imparted to the radiation beam will correspond to a particular functional layer in a device being created in the target portion, such as an integrated circuit.

The patterning device may be transmissive or reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used, or for other factors such as the use of an immersion liquid or the use of a vacuum. Any use of the term "projection lens" herein may be considered as synonymous with the more general term "projection system".

As here depicted, the apparatus is of a transmissive type (e.g. employing a transmissive mask). Alternatively, the apparatus may be of a reflective type (e.g. employing a programmable mirror array of a type as referred to above, or employing a reflective mask).

The lithographic apparatus may be of a type having two (dual stage) or more substrate tables or "substrate supports" (and/or two or more mask tables or "mask supports"). In such "multiple stage" machines the additional tables or supports may be used in parallel, or preparatory steps may be carried out on one or more tables or supports while one or more other tables or supports are being used for exposure.

The lithographic apparatus may also be of a type wherein at least a portion of the substrate may be covered by a liquid having a relatively high refractive index, e.g. water, so as to fill a space between the projection system and the substrate. An immersion liquid may also be applied to other spaces in the lithographic apparatus, for example, between the mask and the projection system. Immersion techniques can be used to increase the numerical aperture of projection systems. The term "immersion" as used herein does not mean that a structure, such as a substrate, must be submerged in liquid, but rather only means that a liquid is located between the projection system and the substrate during exposure.

Referring to FIG. 1, the illuminator IL receives a radiation beam from a radiation source SO. The source and the lithographic apparatus may be separate entities, for example when the source is an excimer laser. In such cases, the source is not considered to form part of the lithographic apparatus and the radiation beam is passed from the source SO to the illuminator IL with the aid of a beam delivery system BD including, for example, suitable directing mirrors and/or a beam expander. In other cases the source may be an integral part of the lithographic apparatus, for example when the source is a mercury lamp. The source SO and the illuminator IL, together with the beam delivery system BD if required, may be referred to as a radiation system.

The illuminator IL may include an adjuster AD configured to adjust the angular intensity distribution of the radiation beam. Generally, at least the outer and/or inner radial extent (commonly referred to as σ-outer and σ-inner, respectively) of the intensity distribution in a pupil plane of the illuminator can be adjusted. In addition, the illuminator IL may include various other components, such as an integrator IN and a condenser CO. The illuminator may be used to condition the radiation beam, to have a desired uniformity and intensity distribution in its cross-section.

The radiation beam B is incident on the patterning device (e.g., mask) MA, which is held on the patterning device support or support structure (e.g. mask table) MT, and is patterned by the patterning device. Having traversed the patterning device (e.g. mask) MA, the radiation beam B passes through the projection system PS, which focuses the beam onto a target portion C of the substrate W. With the aid of the second positioning device PW and position sensor IF (e.g. an interferometric device, linear encoder or capacitive sensor), the substrate table WT can be moved accurately, e.g. so as to position different target portions C in the path of the radiation beam B. Similarly, the first positioning device PM and another position sensor (which is not explicitly depicted in FIG. 1) can be used to accurately position the patterning device (e.g. mask) MA with respect to the path of the radiation beam B, e.g. after mechanical retrieval from a mask library, or during a scan. In general, movement of the patterning device support or support structure (e.g. mask table) MT may be realized with the aid of a long-stroke module (coarse positioning) and a short-stroke module (fine positioning), which form part of the first positioning device PM. Similarly, movement of the substrate table WT or "substrate support" may be realized using a long-stroke module and a short-stroke module, which form part of the second positioner PW. In the case of a stepper (as opposed to a scanner) the patterning device support or support structure (e.g. mask table) MT may be connected to a short-stroke actuator only, or may be fixed. Patterning device (e.g. mask) MA and substrate W may be aligned using mask alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device (e.g. mask) MA, the mask alignment marks may be located between the dies.

The depicted apparatus could be used in at least one of the following modes:

1. In step mode, the patterning device support or support structure (e.g. mask table) MT or "mask support" and the substrate table WT or "substrate support" are kept essentially stationary, while an entire pattern imparted to the radiation beam is projected onto a target portion C at one time (i.e. a single static exposure). The substrate table WT or "substrate support" is then shifted in the X and/or Y direction so that a different target portion C can be exposed. In step mode, the maximum size of the exposure field limits the size of the target portion C imaged in a single static exposure.

2. In scan mode, the patterning device support or support structure (e.g. mask table) MT or "mask support" and the substrate table WT or "substrate support" are scanned synchronously while a pattern imparted to the radiation beam is projected onto a target portion C (i.e. a single dynamic exposure). The velocity and direction of the substrate table WT or "substrate support" relative to the patterning device support or support structure (e.g. mask table) MT or "mask support" may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the patterning device or support structure (e.g. mask table) MT or "mask support" is kept essentially stationary holding a programmable patterning device, and the substrate table WT or "substrate support" is moved or scanned while a pattern imparted to the radiation beam is projected onto a target portion C. In this mode, generally a pulsed radiation source is employed and the programmable patterning device is updated as required after each movement of the substrate table WT or "substrate support" or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
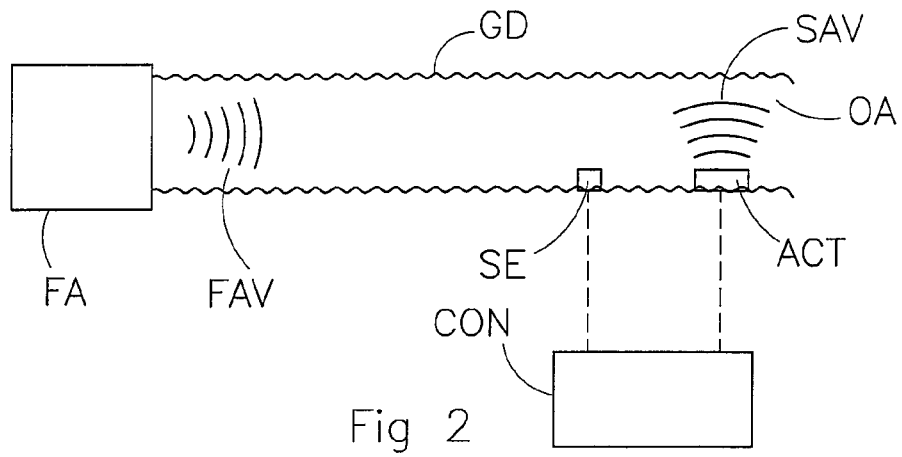
FIG. 2 depicts a schematic view of a part of a lithographic apparatus according to an embodiment of the invention.

FIG. 2 depicts a highly schematic view of a gas duct GD of a lithographic apparatus in which an embodiment of the invention is provided. Fan FA or any other propelling device is provided to propel a gas mixture in the guiding duct GD. An output opening OA may be provided at any suitable location in the lithographic apparatus, e.g. at a downstream lens of the projection system, etc. Although in FIG. 2, the guiding duct GD had been drawn as a straight line, any suitable form may be provided. Also, a plurality of output opening OA may be provided, the gas duct GD may be branched into a plurality of gas ducts, etc. The highly schematic, simplified representation of FIG. 2 has been chosen only for the sake of simplicity. By the fan FA, or by any other cause, acoustic vibrations may be generated in the guiding duct GD, such as schematically indicated by the first acoustic vibration FAV. A sensor SE may be provided in the guiding duct GD to sense the first acoustic vibration FAV. An output signal of the sensor is provided to a control device CON which derives a signal therefrom to drive an actuator ACT, which is positioned near the outlet area OA of the guiding duct GD. The actuator ACT, driven by the control device CON, thereby generates second acoustic vibration SAV. The second acoustic vibration SAV interacts with the first acoustic vibration FAV which may result in a reduction of a total acoustic vibration at the outlet area OA, and may thereby at least partly compensate an effect of the first acoustic vibration FAV at the outlet area OA of the gas duct GD. The second acoustic vibration SAV may thereby be in counter phase with respect to the first acoustic vibration FAV. Thereby, an effect of the first acoustic vibration FAY on a part of the lithographic apparatus to which the gas duct is provided, may at least be decreased. The first acoustic vibration may also or additionally be generated by any other cause: it is for example possible that due to a ribbed structure of the guiding duct, turbulences or other effects an acoustic vibration is provided. The second acoustic vibration may be generated by an acoustic source such as an actuator, or indirectly by excitation of a structure of the lithographic apparatus. The sensor may measure the first acoustic vibration directly, or indirectly by measuring an impact of the first acoustic vibration on a structure of the lithographic apparatus. The gas may include any gas or gas mixture applied in lithographic apparatus, such as cleaned air, dried air, artificial air, a nitrogen, etc or any other gas or gas mixture. Although in FIG. 2 the sensor and actuator have been positioned in the air and outlet area OA of the guiding duct GD, it is also possible that the sensor and/or the actuator are positioned near the fan FA. Thereby, any vibration generated by the fan FA may be suppressed in the guiding duct GD directly. However, with the positioning shown in FIG. 2, other contributions to the first acoustic vibration, such as from a ribbed surface of the guiding duct, may also be taken into account.

In the above referred example where the guiding duct would provide a gas to downstream lens of the projection system, the first acoustic vibration could translate into vibration of such downstream lens element, which translates into an inaccuracy of the projection by the projection system on to the substrate held by the substrate stage WT. By at least partly compensating the first acoustic vibration using the actuator ACT generating a second acoustic vibration, an effect of the first acoustic vibration may at least be decreased, thereby at least reducing an effect of such vibration on to the downstream lens of the projection system, which may translate into an increased accuracy of the projection by the projection system onto the substrate away. Although in FIG. 2 the actuator ACT has been directed so as to provide the second acoustic vibration substantially perpendicular to direction of the guiding duct, other configurations may be provided too. It is for example possible that the actuator ACT provides for a directional emission of the acoustic wave, for example by an acoustic guide, by positioning the actuator ACT so as to direct the second acoustic vibration SAV in the propagating direction of the gas duct GD, or by any other suitable device. The control device CON may include any suitable control system or controller, such as analogue electronics (e.g. an amplifier, analogue filter, etc, digital processing device such as digital signal processor, or any other digital filtering device or filter, etc). The control device may be a separate control device in the lithographic apparatus, however may also be included in any other suitable control device of the lithographic apparatus.

Figure 3:
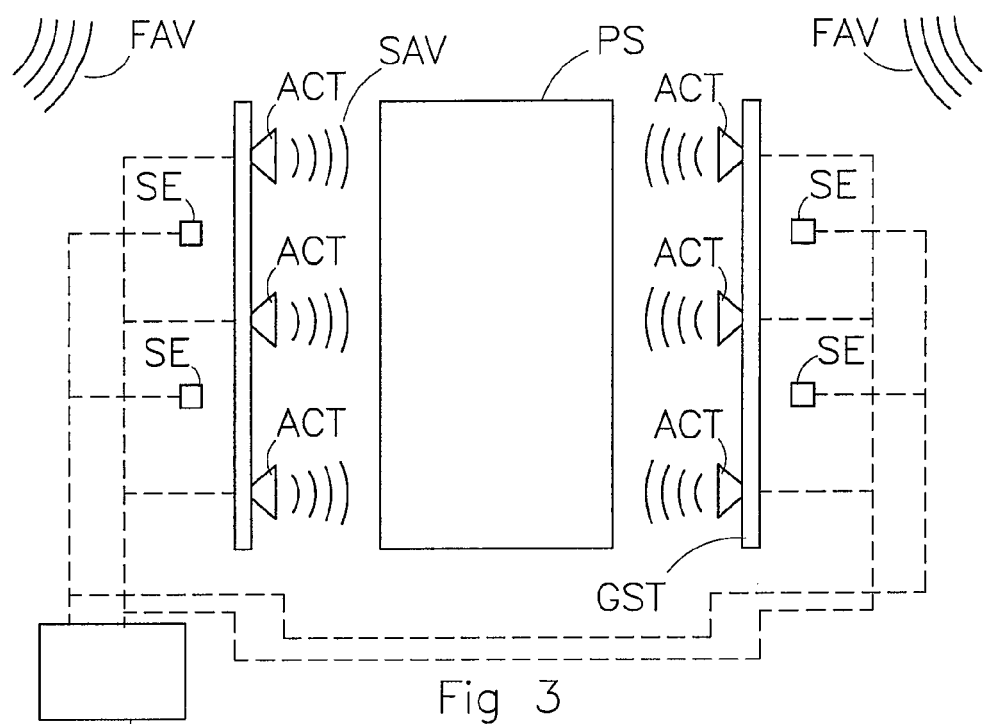
FIG. 3 schematically depicts a part of a lithographic apparatus according to another embodiment of the invention.

FIG. 3 shows the projection system PS of the lithographic apparatus as well as a system according to an aspect of the invention to at least reduce an effect of an acoustic vibration on to the projection system PS or parts thereof. In more detail, a plurality of sensors SE provided to sense an acoustic vibration propagating towards the projection system PS. An output signal of one of more of the sensors SE is provided to control device CON. The control device drives a plurality of actuators ACT in dependency on the sensed acoustic vibration by one or more of the sensors SE. The actuators ACT and sensors SE may be connected to any suitable structure, such as for example a cooling structure GST which surrounds the projection system PS. Contrary to the example shown in FIG. 2, where a single sensor SE and single actuator ACT is provided, FIG. 3 shows a multiple sensor multiple actuator system. One or more of the actuators ACT may be driven in dependency on a signal provided by one or more of the sensors SE, thereby e.g. forming a multiple input multiple output control system. It is to be understood that the cooling structure GST, or any other suitable structure, may be formed by a closed structure or open structure allowing the first acoustic vibration FAV to pass to the projection system PS directly. By making use of a plurality of actuators, each of the actuators may be driven individually by the control device with a suitable signal. Thereby, it is for example possible to take into count phase differences in that a phase of the first acoustic vibration FAV reaching in the projection system PS in an area of one of the actuators, differs from the phase in an area of another one of the actuators, due to e.g. difference in traveled distance. The actuators may be driven accordingly to take account of these phase differences and provide a second acoustic wave to at least reduce the first acoustic vibration at the respective area where reduction may be desired. Alternatively or in addition to the actuator as described, the actuator may include a structural excitator such as a shaker, e.g. in the example shown here a shaker which is arranged to shake the cooling structure GST, which thereby acts as the actuator and which may provide an effective emission of the second acoustic vibration.

Figure 4:
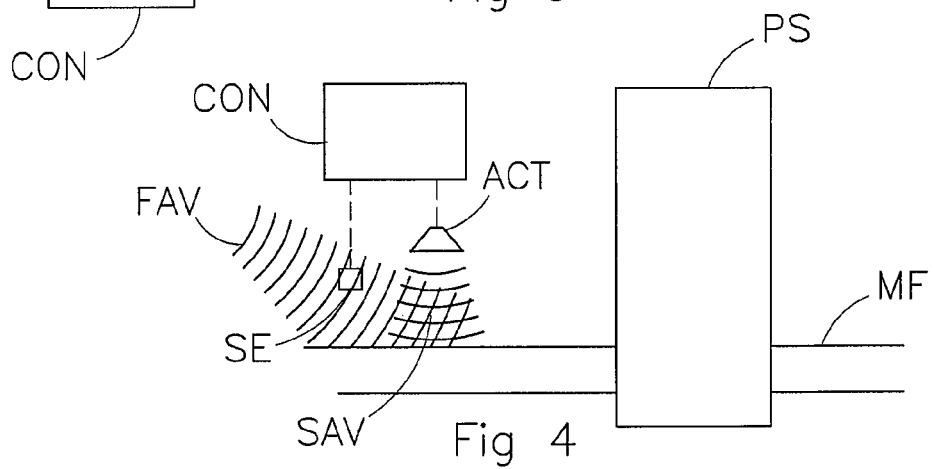
FIG. 4 schematically depicts a part of a lithographic apparatus according to yet another embodiment of the invention.

FIG. 4 shows the projection system PS held by a reference frame, in this example the metrology frame MF of the lithographic apparatus. A first acoustic vibration FAV provides for a disturbance towards the metrology frame MF, which could be transferred to the projection system PS, hence resulting in a possible vibration or other displacement or inaccuracy of one or more lens elements or mirror elements of the projection system PS. Similar to the embodiments shown above, a sensor is provided which measures the first acoustic vibration, an actuator ACT being driven by control device CON in accordance with an output signal of the sensor SE. Thereby, the actuator provides a second acoustic vibration SAV to at least partly compensate the first acoustic vibration traveling to the metrology frame, thereby at least partly compensating for an effect of the first acoustic vibration on the metrology frame MF.

Figure 5:
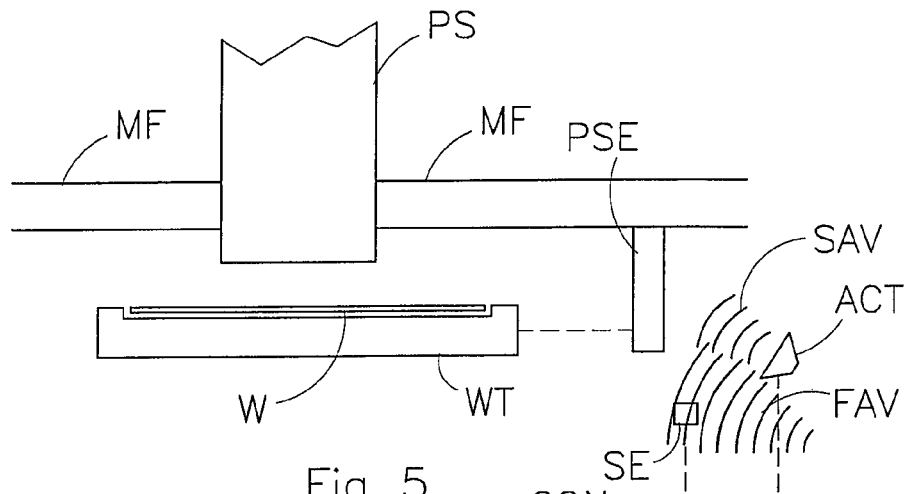
FIG. 5 schematically depicts a part of a lithographic apparatus according to another embodiment of the invention.

FIG. 5 shows the projection system PS mounted to the metrology frame MF. A position sensor PSE (e.g. an interferometer, encoder, etc) measures a position of the substrate table WT to hold the substrate W with respect to the metrology frame, hence with respect to the projection system PS. A first acoustic vibration FAV may result in a vibration or other position error of the position sensor PSE, hence resulting in a measurement error by the position sensor PSE. An effect of such first acoustic vibration may at least be reduced by actuator ACT which irradiates a second acoustic vibration SAV to at least partly compensate the first acoustic vibration at the positioned sensor PSE. Similar to the above embodiments, actuator ACT is driven by a control device CON in dependency on a signal provided to it by sensor SE. The sensor SE senses the first acoustic vibration FAV. It is remarked that the acoustical sensor may also be formed by e.g. a vibration sensor to detect a vibration of the position sensor PSE.

Figure 6:
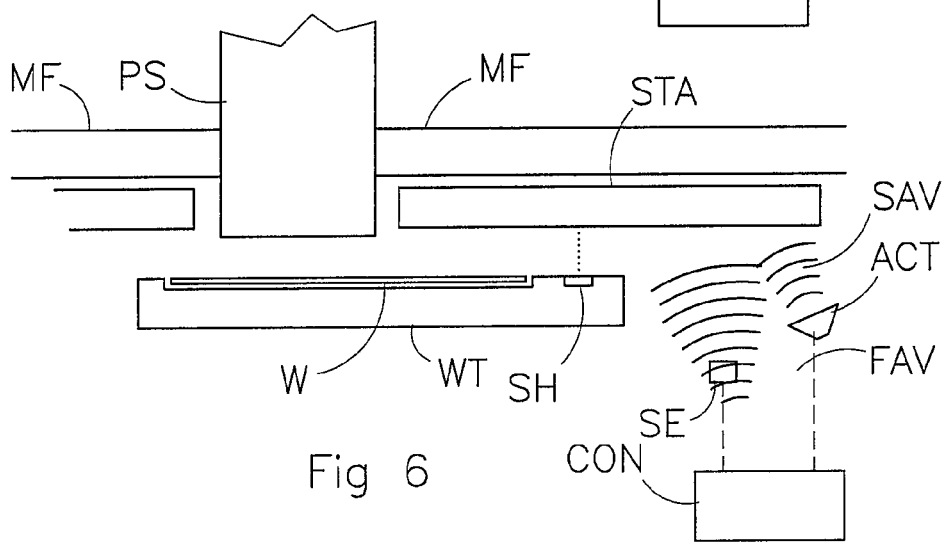
FIG. 6 depicts a schematic view of a part of the lithographic apparatus according to a further embodiment of the invention.

FIG. 6 shows the projection system PS held by metrology frame MF. A position of the substrate stage WT holding the wafer W is measured by a position measurement system including a sensor head SH and a sensor target STA. The sensor head SH may e.g. include an encoder head, interferometer measurement head, etc, the sensor target STA may include a one or two dimensional grade, a mirror, a combination of a grid at the mirror, combination of a grid and mirror, etc. A first acoustic vibration FAV towards the sensor target STA may provide for a vibration or other position inaccuracy of the sensor target STA, which may translate into a measurement error by the position measurement system formed by sensor head SH and sensor target STA. An effect of the first acoustic vibration on the sensor target STA may at least partly be compensated by actuator ACT which provides for a second acoustic vibration SAV to at least partly compensate the first acoustic vibration FAV. The actuator ACT is driven by a control device CON which is provided by a sensor signal of sensor SE, the sensor SE measuring the first acoustic vibration FAV.

Figure 7:
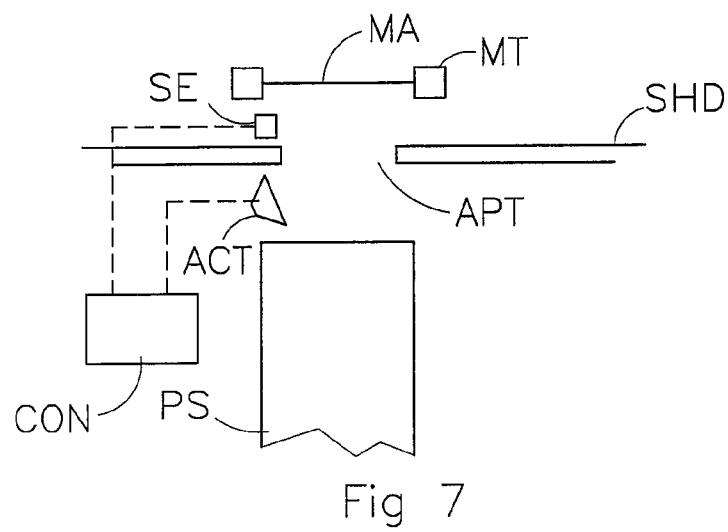
FIG. 7 depicts a schematic view of a part of a lithographic apparatus according to again a further embodiment of the invention.

FIG. 7 shows the projection system PS and support MT holding patterning device MA. A shield SHD is provided between the patterning device support MT and the projection system PS, to reduce an effect of acoustic vibrations by movement of the support MT on to the projection system PS. An aperture APT is provided in the shield SHD to allow passage of the patterned beam to the projection system. A passage of vibration (such as caused by the movement of the patterning device support MT) to the projection system via the aperture APT may at least be reduced by sensing such vibrations by one or more sensors SE, the control device CON being provided with an output signal of the sensor(s), and driving one or more actuators ACT. The actuator or actuators to provide a second acoustic vibration at the aperture APT to there at least partly compensate the vibration such as caused by the movement of the patterning device support MT. In an alternative embodiment, the shield SHD could be provided with a shaker or other actuator to let the shield SHD vibrate, thereby emitting the second acoustic vibration in an effective way.

The actuator(s) and sensor(s) may be connected to the control device CON by any suitable devices, such as for example by analogue lines, by a digital communication connection such as a communication bus, multiplexed bus, or any other suitable a means.

FIGS. 2-4 have provided various embodiments of a lithographic apparatus having an acoustical sensor SE to measure a first acoustic vibration FAV, an actuator ACT to generate a second acoustic vibration SAV in at least an area of interest of the lithographic apparatus, and a control device CON having a sensor input to receive a sensor signal of the acoustical sensor and an actuator output to provide an actuator drive signal to the actuator. The control device being arranged to drive the actuator so as to let the second acoustic vibration at least partly compensate the first acoustic vibration in the area of interest. In the above examples, the area of interest may be formed by an output area of gas duct, a surrounding of a projection system PS, a surface of metrology frame MF, a position sensor PSE of substrate table position measurement system, a stationary target STA of a substrate table position measurement system, an aperture APT of a shield SHD between a patterning device support MT and a projection system PS. It will be understood that many other examples and applications are imaginable in a lithographic apparatus.

In the embodiments according to FIGS. 2-7, instead of applying a sensor to sense the first acoustic vibration, any other devices may be applied to provide the control device with a signal which may represent an effect of the first acoustic vibration. As an example, the control device may be provided with a signal representing a movement of a moveable device of the lithographic apparatus, which movement in operation may generate the first acoustic vibration. The signal representing the movement of the movable device may for example be a setpoint signal providing a desired position of the movable device. Various examples of such embodiments of the invention will now be described with reference to FIGS. 8A and 8B.

Figure 8A:
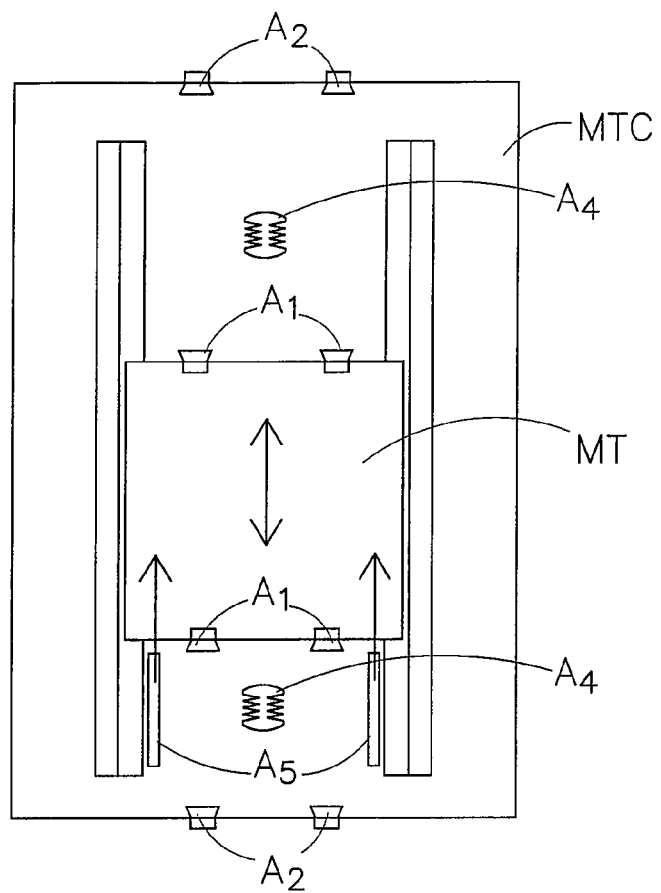
FIGS. 8A and 8B depict schematic views of a part of a lithographic apparatus according to yet other embodiments of the invention.
Figure 8B:
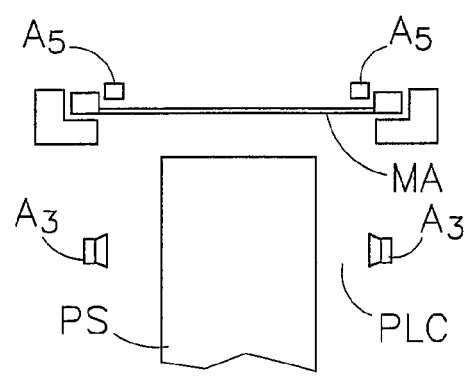

FIG. 8A depicts a highly schematic top view of a patterning device support MT of the lithographic apparatus. The patterning device support may hold a patterning device as described above with reference to FIG. 1. The patterning device support is positioned in a support stage compartment, schematically indicated by MTC. The patterning device support, also indicated as e.g. mask table or mask stage, is movable is a direction as indicated by the arrow in FIG. 8A. Dual actuators may be provided, e.g. a long stroke (coarse) and a short stroke (fine) actuator may be provided. Movements of the patterning device support may result in pressure waves, pressure shocks, gas flows or other disturbances (generally referred to as an acoustic vibration) in a gas surrounding the patterning device support MT, which may in turn disturb other components of the lithographic apparatus, such as the projection system PS or a part thereof. In order to at least reduce an effect of the movements on e.g. the projection system or other relevant part of the lithographic apparatus, one or more actuators may be provided to generate another acoustic vibration to at least partly compensate the first acoustic vibration in an area of interest such as at the projection system. The actuators may be driven by a control device (not shown) which is provided with a suitable input such as a sensor signal of a sensor to measure a disturbance generated by the patterning device support, or a setpoint signal of a patterning device support setpoint (e.g. a position setpoint signal provided to a stage controller). As a first example, actuators A1 are positioned at a front edge and a rear edge of the patterning device support, seen in the direction of movement of the patterning device support MT. As a second example, actuators A2 is positioned in the patterning device support compartment MTC of the lithographic apparatus. The actuators A2 may be positioned at an end of the support stage compartment seen in the direction of movement of the support to achieve an effective counteracting of the disturbances caused by the movement of the patterning device support MT. As a third example, and as shown in the schematic side view of FIG. 8B, actuators A3 are positioned in a lens compartment PLC of the lithographic apparatus. As a fourth example, the actuator includes a bellow A4. which bellow is positioned in the support stage compartment MTC. The control device may be arranged to actuate the bellow in synchronism with a movement of the patterning device support MT, with which a flow balancing may be achieved. In a fifth example, the actuator includes an actuated construction A5 being movable in a same direction of movement as the patterning device support MT. The control device may be arranged to move the actuated construction substantially opposite to a movement of the support, with which a flow balancing may be achieved The actuated construction A5 may be positioned at sides of the patterning device MA, e.g. above or below it. It is to be understood that each of the actuators A1-A5 may be applied in an embodiment having a flowshield SHD between the patterning device support MT and the projection system PS, as described above with reference to FIG. 7. It is remarked that, comparing actuators A1-A3, A1 is closest to possible a source of disturbance, while A3 is closest to a part possibly disturbed by the source of disturbance, thereby each of A1-A3 may have their specific effects.

In the above examples, many sources of acoustic vibration have been shown, such as fans, gas supplies, movable parts such as a substrate stage or wafer stage of the lithographic apparatus. In fact, within the scope of this document, any source of acoustic vibration may be considered, including e.g. a source intentionally generating vibration as well as a source generating an unintended or undesired (parasitic) vibration.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. The skilled artisan will appreciate that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

Although specific reference may have been made above to the use of embodiments of the invention in the context of optical lithography, it will be appreciated that the invention may be used in other applications, for example imprint lithography, and where the context allows, is not limited to optical lithography. In imprint lithography a topography in a patterning device defines the pattern created on a substrate. The topography of the patterning device may be pressed into a layer of resist supplied to the substrate whereupon the resist is cured by applying electromagnetic radiation, heat, pressure or a combination thereof. The patterning device is moved out of the resist leaving a pattern in it after the resist is cured.

The terms "radiation" and "beam" used herein encompass all types of electromagnetic radiation, including ultraviolet (UV) radiation (e.g. having a wavelength of or about 365, 248, 193, 157 or 126 nm) and extreme ultra-violet (EUV) radiation (e.g. having a wavelength in the range of 5-20 nm), as well as particle beams, such as ion beams or electron beams.

The term "lens", where the context allows, may refer to any one or combination of various types of optical components, including refractive, reflective, magnetic, electromagnetic and electrostatic optical components.

While specific embodiments of the invention have been described above, it will be appreciated that the invention may be practiced otherwise than as described. For example, the invention may take the form of a computer program containing one or more sequences of machine-readable instructions describing a method as disclosed above, or a data storage medium (e.g. semiconductor memory, magnetic or optical disk) having such a computer program stored therein.

The descriptions above are intended to be illustrative, not limiting. Thus, it will be apparent to one skilled in the art that modifications may be made to the invention as described without departing from the scope of the claims set out below.

What is claimed is:

1. A lithographic apparatus arranged to transfer a pattern from a patterning device onto a substrate, comprising:
   a source to generate a first acoustic vibration that travels to an object of the lithographic apparatus;
   an acoustical sensor configured to measure the first acoustic vibration generated by the source towards the object of the lithographic apparatus, the measurement of the first acoustic vibration by the acoustical sensor being representative of an impact of the first acoustic vibration on the object;
   an actuator configured to generate a second acoustic vibration, the actuator being positioned spaced apart from said object so that, in use, the second acoustic vibration emitted by said actuator propagates towards said object and interacts with the first acoustic vibration such that said first acoustic vibration is at least partly compensated for by said second acoustic vibration when said first acoustic vibration travels towards the object; and
   a control device having an actuator output to provide an actuator drive signal to the actuator and a sensor input to receive a sensor signal of the acoustical sensor that is representative of said measurement, the control device being adapted to drive the actuator in response to the sensor signal to at least partly compensate the first acoustic vibration in an area of the object by the second acoustic vibration.

2. The lithographic apparatus according to claim 1, comprising a gas duct configured to guide a gas to a destination in the lithographic apparatus, the acoustical sensor being arranged to measure an acoustic vibration in the gas duct, the actuator being positioned so as to produce the second acoustic vibration in the gas duct.

3. The lithographic apparatus according to claim 2, wherein the actuator is positioned to produce the second acoustic vibration in an outlet area of the gas duct.

4. The lithographic apparatus according to claim 2, wherein the actuator is positioned to produce the second acoustic vibration in an area of the gas duct of the source of acoustic vibration.

5. The lithographic apparatus according to claim 2, wherein the actuator is positioned in the gas duct.

6. The lithographic apparatus according to claim 1, comprising:
   an illumination system configured to condition a radiation beam;
   a patterning device support constructed to support the patterning device, the patterning device being capable of imparting the radiation beam with a pattern in its cross-section to form a patterned radiation beam;
   a substrate support constructed to hold the substrate; and
   a projection system configured to project the patterned radiation beam onto a target portion of the substrate,
   wherein the acoustical sensor is positioned to measure the first acoustic vibration towards at least a part of the projection system, the actuator being positioned to emit the second acoustic vibration towards at least the part of the projection system.

7. The lithographic apparatus according to claim 6, wherein the actuator is mounted to a cooling structure circumfering at least the part of the projection system.

8. The lithographic apparatus according to claim 6, wherein a plurality of actuators is provided, each of the actuators configured to emit a respective second acoustic vibration to a respective part of the projection system.

9. The lithographic apparatus according to claim 1, comprising:
   an illumination system configured to condition a radiation beam;
   a patterning device support constructed to support the patterning device, the patterning device being capable of imparting the radiation beam with a pattern in its cross-section to form a patterned radiation beam;
   a substrate support constructed to hold the substrate;
   a projection system configured to project the patterned radiation beam onto a target portion of the substrate; and
   a metrology frame to hold the projection system,
   wherein the acoustical sensor is positioned to measure the first acoustic vibration towards at least a part of the metrology frame, the actuator being positioned to emit the second acoustic vibration towards at least the part of the metrology frame.

10. The lithographic apparatus according to claim 1, comprising:
    an illumination system configured to condition a radiation beam;
    a patterning device support constructed to support the patterning device, the patterning device being capable of imparting the radiation beam with a pattern in its cross-section to form a patterned radiation beam;
    a substrate support constructed to hold the substrate;
    a projection system configured to project the patterned radiation beam onto a target portion of the substrate; and
    a position sensor to measure a position of one Of the supports,
    wherein the acoustical sensor is positioned to measure the first acoustic vibration towards the position sensor, the actuator being positioned to emit the second acoustic vibration towards the position sensor.

11. The lithographic apparatus according to claim 1, comprising:
    an illumination system configured to condition a radiation beam;
    a support constructed to support the patterning device, the patterning device being capable of imparting the radiation beam with a pattern in its cross-section to form a patterned radiation beam;
    a substrate support constructed to hold the substrate;
    a projection system configured to project the patterned radiation beam onto a target portion of the substrate; and
    a position sensor to measure a position of one of the supports, the position sensor comprising a sensor head and a sensor target,
    wherein the acoustical sensor is positioned to measure the first acoustic vibration towards the sensor target, the actuator being positioned to emit the second acoustic vibration towards the sensor target.

12. The lithographic apparatus according to claim 1, comprising:
    an illumination system configured to condition a radiation beam;
    a patterning device support constructed to support the patterning device, the patterning device being capable of imparting the radiation beam with a pattern in its cross-section to form a patterned radiation beam;
    a substrate support constructed to hold the substrate;
    a projection system configured to project the patterned radiation beam onto a target portion of the substrate; and
    a shield positioned between the patterning device support and the projection system, the shield having an aperture to allow passage of the patterned beam towards the projection system,
    wherein the sensor is positioned to measure the first acoustic vibration directed from the support towards the passage, the actuator being positioned to emit the second acoustic vibration towards the passage.

13. The lithographic apparatus according to claim 1, wherein the source comprises a movable device of which a movement may in operation generate the first acoustic vibration.

14. The lithographic apparatus according to claim 13, wherein the control device comprises an input to receive a signal representing the movement of the movable device, and wherein the control device is arranged to determine the actuator drive signal from the signal representing the movement of the movable device.

15. The lithographic apparatus according to claim 13, wherein the actuator is positioned at a front edge or a rear edge of the movable device, seen in a direction of movement of the movable device.

16. The lithographic apparatus according to claim 13, wherein the movable device comprises at least a patterning device support to support the patterning device or a substrate table to hold the substrate.

17. The lithographic apparatus according to claim 16, wherein the actuator is positioned in a support stage compartment of the lithographic apparatus.

18. The lithographic apparatus according to claim 17, wherein the actuator is positioned at an end of the support stage compartment seen in a direction of movement of the support.

19. The lithographic apparatus according to claim 13, wherein the actuator is positioned in a lens compartment of the lithographic apparatus.

20. The lithographic apparatus according to claim 13, wherein the actuator comprises a bellow.

21. The lithographic apparatus according to claim 20, wherein the bellow is positioned in the support stage compartment.

22. The lithographic apparatus according to claim 13, wherein the actuator comprises an actuated construction being movable is a same direction of movement as the movable device.

23. The lithographic apparatus according to claim 22, wherein the control device is arranged to move the actuated construction substantially opposite to a movement of the movable device.

24. The lithographic apparatus according to claim 23, wherein the control device is arranged to move the actuated construction so as to generate a gas displacement having a same order of magnitude as a gas displacement by the movement of the movable device.

25. The lithographic apparatus according to claim 1, wherein the area includes an output area of a gas duct, an area surrounding a projection system, a surface of a metrology frame, a position sensor of a substrate table position measurement system, a stationary target of a substrate table position measurement system, an aperture of a shield between a patterning device support and the projection system, or any combination thereof.

26. The lithographic apparatus according to claim 1, wherein a face of the actuator that, in use, emits said second acoustic vibration is out of contact with an element of the lithographic apparatus.

27. A lithographic apparatus arranged to transfer a pattern from a patterning device onto a substrate, comprising:
    an acoustical sensor configured to measure a first acoustic vibration generated by a source and that travels towards an object of the lithographic apparatus, the measurement of the first acoustic vibration by the acoustical sensor being representative of an impact of the first acoustic vibration on the object;
    an actuator configured to generate a second acoustic vibration, the actuator being positioned spaced apart from said object so that, in use, the second acoustic vibration emitted by said actuator propagates towards said object and interacts with at least part of the first acoustic vibration before said at least part of the first acoustic vibration interacts with the object such that said first acoustic vibration is at least partly compensated for by said second acoustic vibration when said first acoustic vibration travels towards the object; and
    a control device having an actuator output to provide an actuator drive signal to the actuator and a sensor input to receive a sensor signal of the acoustical sensor that is representative of said measurement, the control, device being adapted to drive the actuator in response to the sensor signal to at least partly compensate the first acoustic vibration in an area of the object by the second acoustic vibration.

28. The lithographic apparatus according to claim 27, comprising:
    a patterning device support constructed to support a patterning device, the patterning device being capable of imparting a radiation beam with a pattern in its cross-section to form a patterned radiation beam;
    a substrate support constructed to hold the substrate;
    a projection system configured to project the patterned radiation beam onto a target portion of the substrate; and
    a metrology frame to hold the projection system,
    wherein the acoustical sensor is positioned to measure the first acoustic vibration towards at least a part of the metrology frame, the actuator being positioned to emit the second acoustic vibration towards at least the part of the metrology frame.

* * * * *